United States Patent
Nishikage et al.

(10) Patent No.: US 11,094,536 B2
(45) Date of Patent: Aug. 17, 2021

(54) METHOD OF MANUFACTURING SEMICONDUCTOR ELEMENTS

(71) Applicant: NICHIA CORPORATION, Anan (JP)

(72) Inventors: Haruhiko Nishikage, Anan (JP); Yoshinori Miyamoto, Tokushima (JP); Yasunobu Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 16 days.

(21) Appl. No.: 16/802,782

(22) Filed: Feb. 27, 2020

(65) Prior Publication Data

US 2020/0279730 A1  Sep. 3, 2020

(30) Foreign Application Priority Data

Feb. 28, 2019 (JP) .............................. JP2019-036768
Feb. 4, 2020 (JP) .............................. JP2020-016939

(51) Int. Cl.
*H01L 21/02* (2006.01)
*H01L 21/78* (2006.01)
*H01L 29/20* (2006.01)

(52) U.S. Cl.
CPC .......... *H01L 21/0243* (2013.01); *H01L 21/78* (2013.01); *H01L 21/02381* (2013.01); *H01L 29/2003* (2013.01)

(58) Field of Classification Search
CPC ................. H01L 21/0243; H01L 21/78; H01L 21/02381; H01L 29/2003; H01L 21/2007; H01L 21/02433; H01L 21/0242; H01L 33/007; H01L 21/0254; H01L 21/7806; H01L 33/0075; H01L 33/0066; H01L 33/32
See application file for complete search history.

(56) References Cited

U.S. PATENT DOCUMENTS

| 5,710,057 A * | 1/1998 | Kenney ............. H01L 21/76251 117/915 |
| 2013/0087807 A1 | 4/2013 | Ikuta et al. |
| 2014/0061942 A1* | 3/2014 | Enquist ............. H01L 23/49866 257/774 |

(Continued)

FOREIGN PATENT DOCUMENTS

| JP | 2000-331940 A | 11/2000 |
| JP | 2008-290919 A | 12/2008 |

(Continued)

*Primary Examiner* — Thanh T Nguyen
(74) *Attorney, Agent, or Firm* — Foley & Lardner LLP

(57) ABSTRACT

A method of manufacturing semiconductor elements includes: disposing a semiconductor layer made of a nitride semiconductor on a first wafer; and bonding a second wafer to the first wafer via the semiconductor layer. The first wafer has an upper surface including a first region and a second region surrounding a periphery of the first region and located lower than the first region. In a top view of the first wafer, a first distance between an edge of the first wafer and the first region of the first wafer in each of a plurality of first directions parallel to respective m-axes of the semiconductor layer is smaller than a second distance between the edge of the first wafer and the first region of the first wafer in each of a plurality of second directions parallel to respective a-axes of the semiconductor layer.

18 Claims, 10 Drawing Sheets

(56) References Cited

U.S. PATENT DOCUMENTS

| | | | |
|---|---|---|---|
| 2016/0155892 A1* | 6/2016 | Li | H01L 24/95 |
| | | | 257/89 |
| 2019/0148130 A1* | 5/2019 | Chiang | H01L 21/304 |
| | | | 257/797 |
| 2020/0098703 A1* | 3/2020 | Wei | H01L 21/3221 |
| 2021/0028754 A1* | 1/2021 | Hurwitz | H01L 23/5386 |

FOREIGN PATENT DOCUMENTS

| | | |
|---|---|---|
| JP | 2012-006830 A | 1/2012 |
| WO | WO-2011/161975 A1 | 12/2011 |

* cited by examiner

METHOD OF MANUFACTURING SEMICONDUCTOR ELEMENTS

CROSS-REFERENCE TO RELATED PATENT APPLICATIONS

The present application claims priority under 35 U. S. C. § 119 to Japanese Patent Application No. 2019-036768, filed Feb. 28, 2019, and Japanese Patent Application No. 2020-016939 filed on Feb. 4, 2020, the contents of which are incorporated herein by reference in their entirety.

BACKGROUND

The present disclosure relates to a method of manufacturing semiconductor elements.

Semiconductor elements such as light-emitting diodes (LEDs) can be manufactured using a method, for example, described in WO2011-161975A, in which a semiconductor layer is grown on a wafer such as a sapphire substrate serving as a growth substrate, and subsequently bonded with a support substrate. In such a method, cracks may occur in the semiconductor layer, resulting in a reduction in the productivity.

SUMMARY

The present disclosure is devised in the light of such circumstances, and it is thus an object thereof to provide a method of manufacturing semiconductor elements with good productivity.

A method of manufacturing semiconductor elements according to one embodiment of the present invention includes disposing a semiconductor layer made of a nitride semiconductor on a first wafer, and bonding a second wafer to the first wafer via the semiconductor layer. The first wafer has an upper surface including a first region and a second region surrounding a periphery of the first region and located lower than the first region. In a top view of the first wafer, a first distance between an edge and the first region of the first wafer in each of first directions respectively passing through a center of the first wafer and also in parallel to a corresponding one of m-axes of the semiconductor layer is smaller than a second distance between an edge and the first region of the first wafer in each of second directions respectively passing through the center of the first wafer and also in parallel to a corresponding one of a-axes of the semiconductor layer. The second wafer has a lower surface and an upper surface, the lower surface including a flat portion and an inclined portion surrounding the flat portion, the inclined portion inclining upward toward the upper surface. In the bonding the second wafer, the second wafer is bonded to the first wafer such that outer end portions of the first wafer located in the first directions are opposite to the inclined portion of the second wafer.

Using the method of manufacturing according to certain embodiments of the disclosure, semiconductor elements can be manufactured with improved productivity.

DETAILED DESCRIPTION

Figure 1:
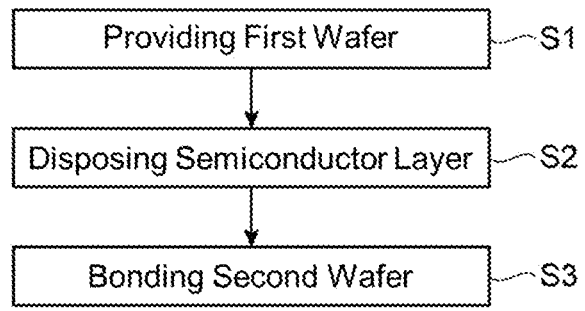
FIG. 1 is a flow chart showing a procedure of a method of manufacturing semiconductor elements according to one embodiment of the present invention.

Certain embodiments of the present invention will be described below with reference to the drawings. The drawings referred to in the description below are intended to schematically illustrate the embodiments. The size, space, interval, and locational relationship of the components may be exaggerated, a portion of a component may not be shown, and the dimensional ratios and the like of the components may differ from the actual ratios. The drawings may also include the components that have different dimensional relations and ratios among one another. In the description below, the same designations or the same reference numerals denote the same or like members, and repeated detailed descriptions will be omitted.

A method of manufacturing semiconductor elements according to certain embodiments of the present invention will be schematically illustrated below. The method of manufacturing semiconductor elements according to certain embodiments includes providing a first wafer 10 (Step S1), disposing a semiconductor layer 20 made of a nitride semiconductor on the first wafer 10 (Step S2), and bonding a second wafer 30 to the first wafer 10 via the semiconductor layer 20 (Step S3).

The first wafer 10 has an upper surface 15 including a first region 11 and a second region 12 surrounding a periphery of the first region 11 and located lower than the first region 11. In a top view of the first wafer 10, a first distance D1 between an edge 17 and the first region 11 of the first wafer 10 in each of first directions V1 passing through a center of the first wafer 10 and parallel respective m-axes of the semiconductor layer 20 is smaller than a second distance D2 between the edge 17 and the first region 11 of the first wafer 10 in each of second directions V2 passing through the center of the first wafer 10 and parallel to respective a-axes of the semiconductor layer 20. The second wafer 30 has a lower surface 31 and an upper surface 35, the lower surface 31 including a flat portion 32 and an inclined portion 33 surrounding the flat portion 32, the inclined portion 33 inclining upward toward the upper surface 35. In the step of bonding the second wafer 30 (Step S3), the second wafer 30 is bonded to the first wafer 10 such that outer end portions of the first wafer 10 located in the first directions V1 are opposite to the inclined portion 33 of the second wafer 30.

The method of manufacturing semiconductor elements according to one embodiment will be described in detail below. FIG. 1 is a flow chart showing a procedure of a method of manufacturing semiconductor elements according to one embodiment of the present invention.

Providing First Wafer 10

Figure 2A:
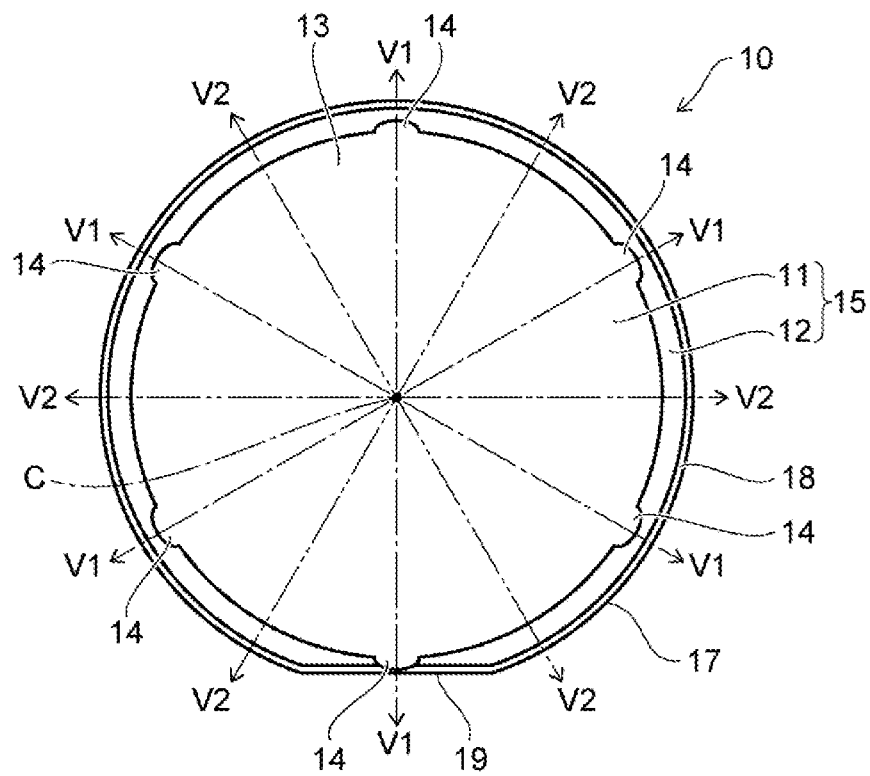
FIG. 2A is a schematic plan view illustrating a first wafer according to one embodiment of the present invention.
Figure 2B:
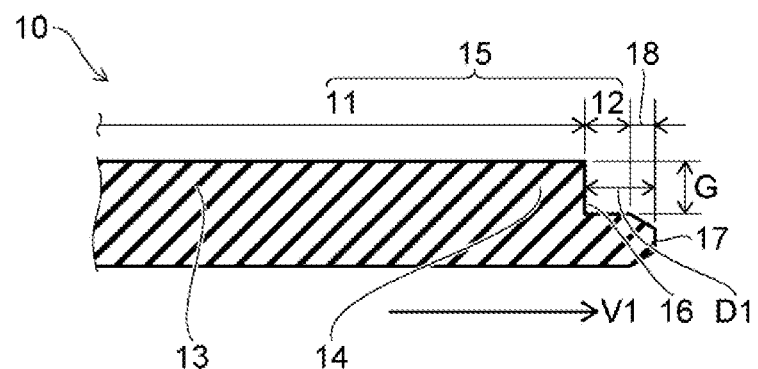
FIG. 2B is a schematic partial cross-sectional end view taken along one of first directions shown in FIG. 2A.
Figure 2C:
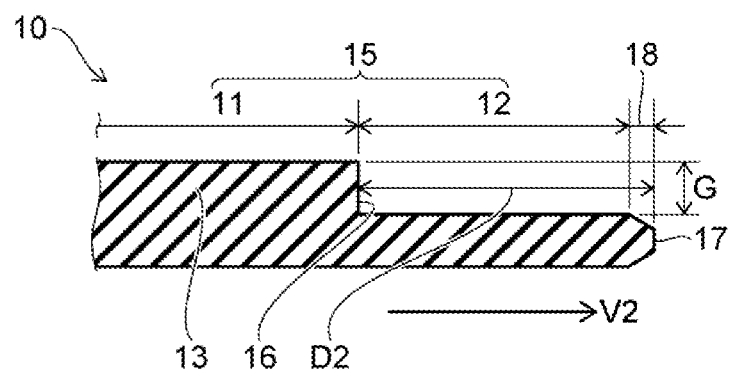
FIG. 2C is a schematic partial cross-sectional end view taken along one of second directions shown in FIG. 2A.

A first wafer 10 is provided (Step S1 in the flowchart in FIG. 1). FIG. 2A is a schematic plan view illustrating a first wafer 10 according to the present embodiment. FIG. 2B is a schematic partial cross-sectional end view taken along one of the first directions V1 in FIG. 2A. FIG. 2C is a schematic partial cross-sectional end view taken along one of the second directions V2 shown in FIG. 2A.

The first wafer 10 is, for example, a sapphire substrate, and for example, made of a single crystal sapphire. As shown in FIG. 2A, the first wafer 10 has a shape of substantially circular plate with a diameter of, for example, about 100 mm. The first wafer 10 may be provided with an orientation flat 19 that has a linear profile obtained by removing a chord-shape portion from the circular plate shape of the wafer. The outer periphery of the first wafer 10 is provided with a bevel portion 18. As shown in FIG. 2B and FIG. 2C, the thickness of the first wafer 10 decreases toward the edge 17 in the bevel portion 18.

In the present specification, the term "upper surface 15" of the first wafer 10 refers to the upper surface except for the bevel portion 18. The upper surface 15 is, for example, oriented along c-plane of the sapphire of the first wafer 10. For example, the upper surface 15 and a sapphire c-plane are at an angle of 5° or less with each other. The upper surface 15 may be inclined relative to the sapphire c-plane.

First directions V1 and second directions V2 are determined on the upper surface 15 of the first wafer 10. The first directions V1 and the second directions V2 are parallel to the upper surface 15, and in the present embodiment, there are six first directions V1 and six second directions V2. As described below, when the semiconductor layer 20 is disposed on the upper surface 15 of the first wafer 10, each of the first directions V1 passes through the center C of the first wafer 10 and is a positive direction along one of the m-axes of the semiconductor layer 20. Meanwhile, when the semiconductor layer 20 is disposed on the upper surface 15 of the first wafer 10, each of the second directions V2 passes through the center C of the first wafer 10 and is a positive direction along one of the a-axes of the semiconductor layer 20. The center C of the first wafer 10 corresponds to a center of a circumscribed circle of the first wafer 10 in a top view. For example, an angle between two adjacent ones of the first directions V1 is 60°. For example, an angle between two adjacent one of the second directions V2 is 60°. For example, an angle between one of the first directions V1 and its adjacent one of the second directions V2 is 30°.

The first wafer 10 has an upper surface 15 including a first region 11 and a second region 12. The second region 12 surrounds a periphery of the first region 11 and is located lower than the first region 11. A step 16 is formed between the first region 11 and the second region 12. For example, the second region 12 is located 2 μm or more lower than the first region 11. In other words, the height G of the step 16 is, for example, 2 μm or greater, for example, 6 μm. The maximum height G of the step 16 can be appropriately determined. For example, the maximum height G of the step 16 can be, for example, 30 μm or less.

In a top view, the first region 11 has a shape that includes a circular part 13 with six protrusions 14 at its outer periphery, the protrusions 14 extending toward the edge 17 of the first wafer 10 along respective first directions V1. For example, the center of the circular part 13 and the center C of the first wafer 10 coincide. The extending length of each of the protrusions 14 can be, for example, in a range of 0.1 mm to 10 mm, preferably in a range of 0.5 mm to 5 mm.

Accordingly, the first distance D1 between the edge 17 and the first region 11 of the first wafer 10 in each of the first directions V1 is smaller than the second distance D2 between the edge 17 and the first region 11 of the first wafer 10 in each of the second directions V2, by the extending length of the protrusions 14. That is, the first distance D1 is smaller than the second distance D2 (D1<D2). The first distance D1 can be, for example, in a range of 0.1 mm to 5 mm, preferably in a range of 0.2 mm to 3 mm. The second distance D2 can be, for example, in a range of 1 mm to 10 mm.

The second region 12 is interposed between the circular part 13 and a bevel portion 18. Meanwhile, the second region 12 may be or may not be interposed between the protrusions 14 and the bevel portion 18. In the example shown in FIG. 2A and FIG. 2B, the protrusions 14 do not reach the bevel portion 18 and the second region 12 is interposed between the protrusions 14 and the bevel portion 18.

Disposing Semiconductor Layer 20

Next, a semiconductor layer 20 made of a nitride semiconductor is disposed on the first wafer 10 (Step S2 in the flowchart in FIG. 1).

Figure 3A:
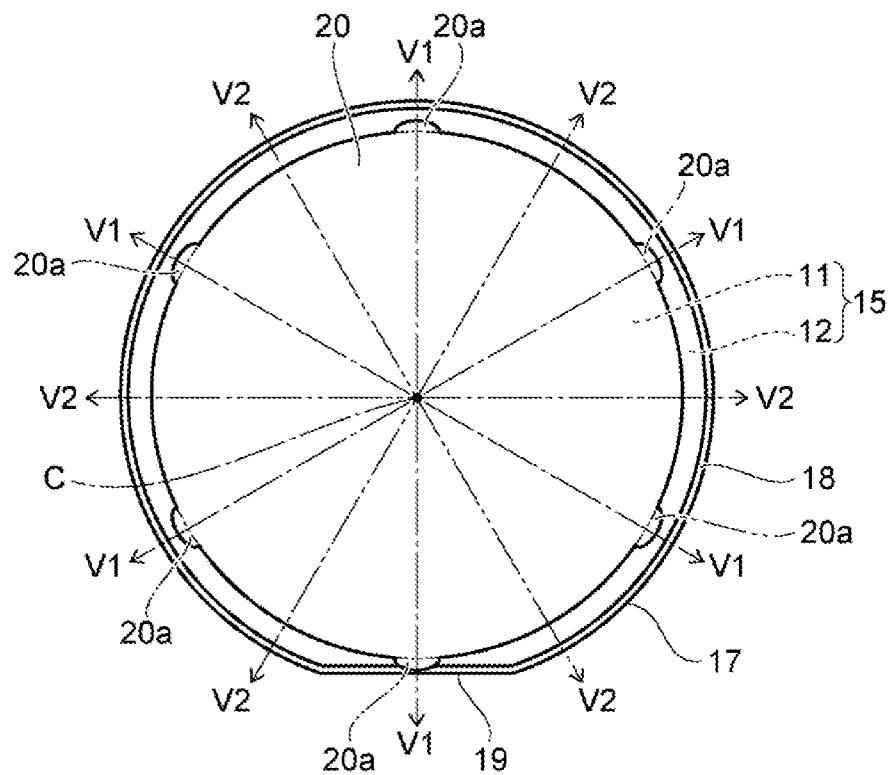
FIG. 3A is a schematic plan view illustrating the first wafer and a semiconductor layer according to one embodiment of the present invention.
Figure 3B:
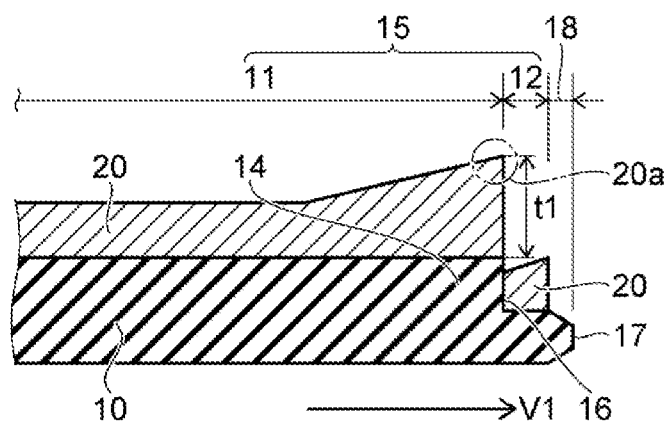
FIG. 3B is a schematic partial cross-sectional end view taken along the first direction in FIG. 3A.
Figure 3C:
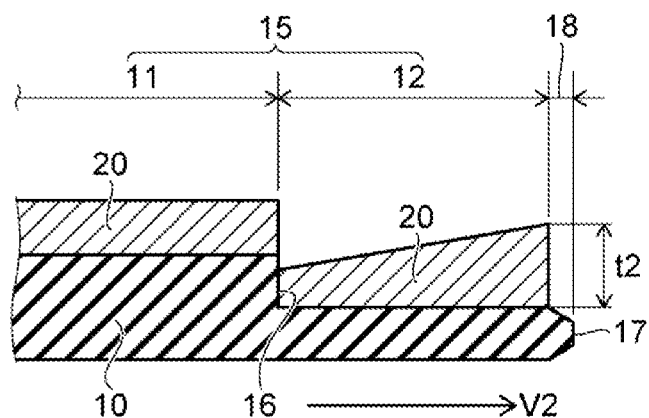
FIG. 3C is a schematic partial cross-sectional end view taken along one of the second directions shown in FIG. 3A.
Figure 4A:
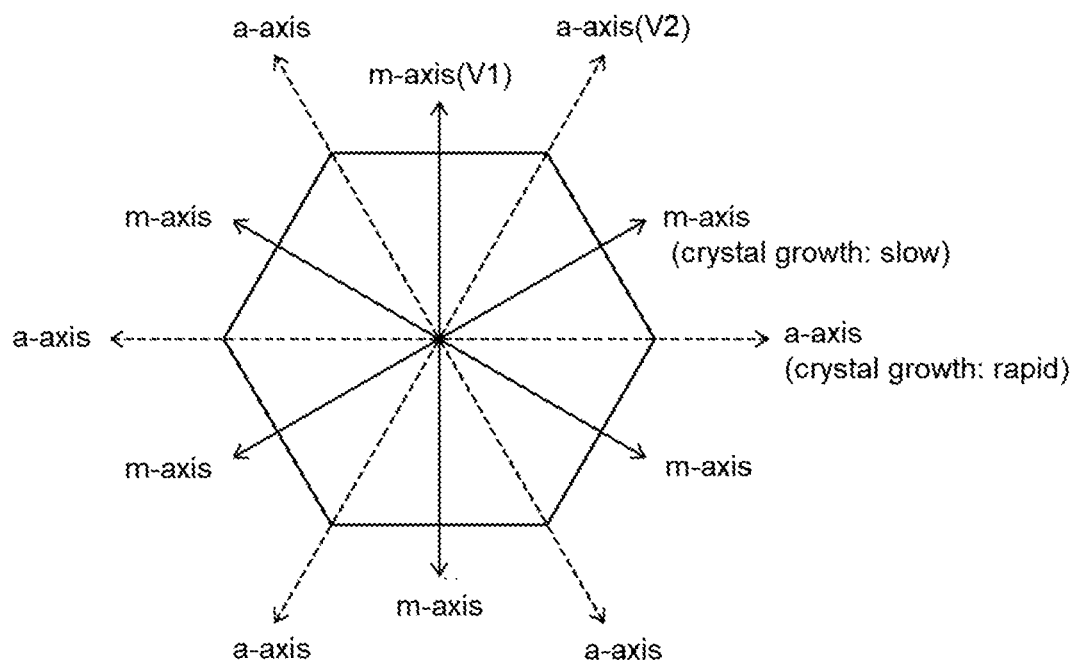
FIG. 4A is a schematic plan view illustrating a crystal orientation of the semiconductor layer.
Figure 4B:
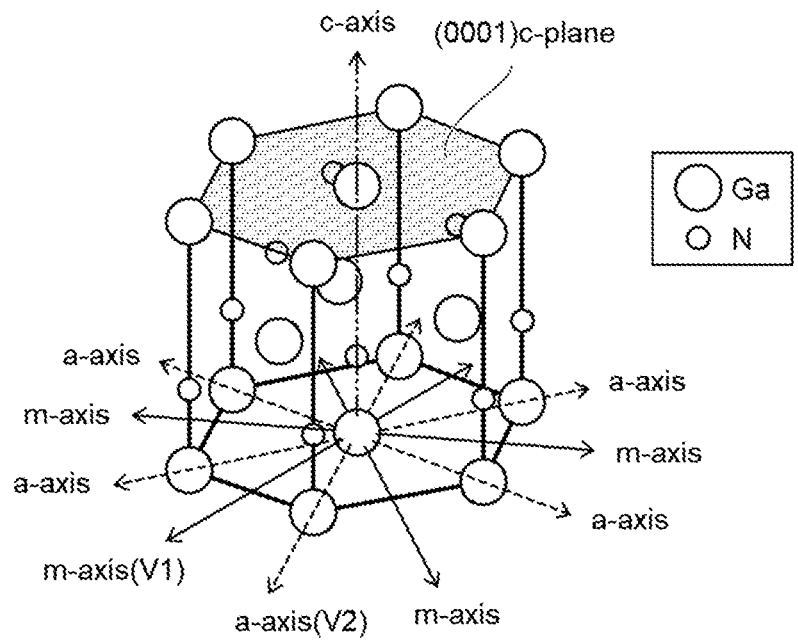
FIG. 4B is a schematic perspective view illustrating the crystal orientation of the semiconductor layer.

FIG. 3A is a schematic plan view illustrating the first wafer 10 and a semiconductor layer 20 according to the present embodiment. FIG. 3B is a schematic partial cross-sectional end view taken along a first direction V1 in FIG. 3A. FIG. 3C is a schematic partial cross-sectional end view taken along a second direction V2 shown in FIG. 3A. FIG. 4A is a schematic plan view illustrating the crystal orientation of the semiconductor layer 20. FIG. 4B is a schematic perspective view illustrating the crystal orientation of the semiconductor layer 20 that has a hexagonal crystal structure.

As shown in FIG. 3A to FIG. 3C, the semiconductor layer 20 can be grown, for example, by using the first wafer 10 as a growth substrate and using a physical vapor-phase growth method such as a metal organic chemical vapor deposition (MOCVD) method, epitaxially grown on the upper surface 15 of the first wafer 10. The semiconductor layer 20 includes, for example, a III-V nitride semiconductor (In$_X$Al$_Y$Ga$_{1-X-Y}$N, where 0≤X, 0≤Y, and X+Y≤1). The semiconductor layer 20 includes, for example, an n-type semiconductor layer, a p-type semiconductor layer, and a light emitting layer located between the n-type semiconductor layer and the p-type semiconductor layer. The light from the light-emitting layer may have a peak emission wavelength in a range of 330 nm to 400 nm. In such a case, when the semiconductor layer 20 contains a semiconductor layer that does not contain aluminum (Al) such as a semiconductor layer made of gallium nitride (GaN), light from the light-emitting layer can be easily absorbed by the semiconductor layer. With the semiconductor layer 20 containing, for example, an AlGaN layer that contains Al, a high transmittance to light emitted from the light emitting layer can be obtained. The semiconductor layer 20 includes, for example, Al$_{x1}$Ga$_{1-x1}$N (0.03≤x1≤0.08).

In the structure described above, the outer peripheral portion of the semiconductor layer 20 has a thickness greater than other portions of the semiconductor layer 20. The term "outer peripheral portion of the semiconductor layer 20" refers to a portion located at an outer end portion of the first region 11 of the semiconductor layer 20. When the semiconductor layer 20 includes a layer that contains Al, the tendency of the outer peripheral portion of the semiconductor layer 20 becoming greater than other regions of the semiconductor layer 20 becomes more apparent compared to that the semiconductor layer does not contain Al. The cause of such a tendency is thought that when the semiconductor layer 20 includes a semiconductor layer that contains Al, unintended growth may easily occur in the outer peripheral portion of the semiconductor layer 20. The thickness of the outer peripheral portion of the semiconductor layer 20 depends on the directions as seen from the center C. The thickness t1 of the end portions located in the first directions V1 from the center C is greater than the thickness t2 of the outer end portions located in the second directions V2 from the center C. That is, the film thickness t1 is greater than the film thickness t2 (t1>t2). In the present specification, the term "thick film portion 20a" refers to each portion of the semiconductor layer 20 disposed on the first region 11, located at the outer end portions along each of the first directions V1 as seen from the center C, that is, portions having a thickness of t1 or close to t1. The thick film portions 20a of the semiconductor layer 20 are present at outer end portions at six locations along the first directions V1 from the center C.

The reason for the occurrence of such uneven thickness has not been clearly determined, but it is assumed as below. As described above, the first directions V1 are positive directions started from the center C respectively along the m-axes of the semiconductor layer 20, and the second directions V2 are positive directions started from the center C respectively along the a-axes of the semiconductor layer 20. Also, as shown in FIG. 4A and FIG. 4B, the (0001)c-plane of the semiconductor layer 20 is in parallel to the upper surface 15 of the first wafer 10. In this case, the growth rate of the crystal on the (0001)c-plane of the semiconductor layer 20 along the m-axes (first directions V1) is lower than the growth rate along the a-axes (second directions V2). Accordingly, it is assumed that the crystal growth of the semiconductor layer 20 on the (0001)c-plane in the second directions V2 with higher crystal growth rate affects the crystal growth in the first directions V1 with lower crystal growth rate, which facilitates the crystal growth at the outer end portions in the first directions V2, resulting in a greater thickness at the end portions in the first directions V1 than respective adjacent portions.

In the first region 11 of the first wafer 10, protrusions 14 are formed in the first directions V1 as seen from the center C, and the first distance D1 is smaller than the second distance D2. Accordingly, the thick film portions 20a of the semiconductor layer 20 are located at outer periphery side of the first wafer 10 relative to the outer end portions in the second directions V2 of the semiconductor layer 20. The thick film portions 20a of the semiconductor layer 20 are formed in the portions of the first region 11 where the protrusions 14 are provided.

Bonding Second Wafer 30

Next, a second wafer 30 is bonded to the first wafer 10 via the semiconductor layer 20 (Step S3 in the flowchart in FIG. 1). The second wafer 30 is, for example, a silicon wafer.

Figure 5:
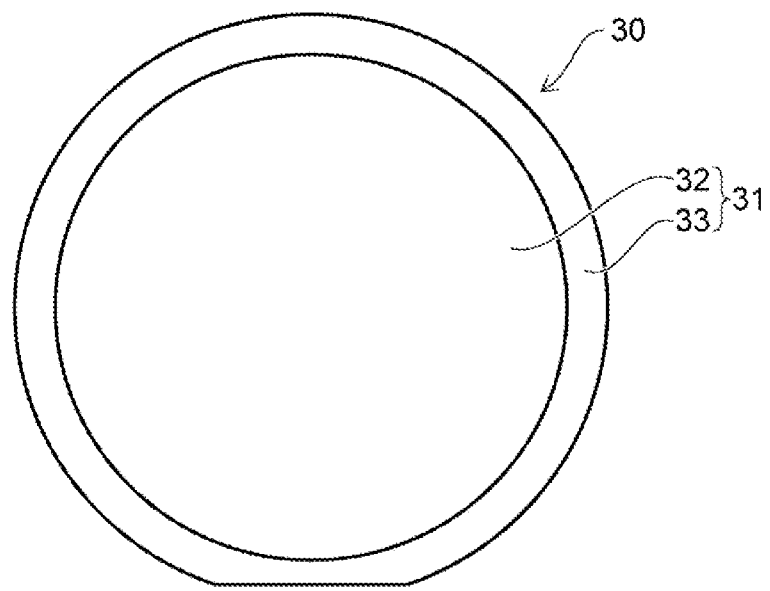
FIG. 5 is a schematic bottom plan view illustrating a second wafer according to one embodiment of the present invention.
Figure 6A:
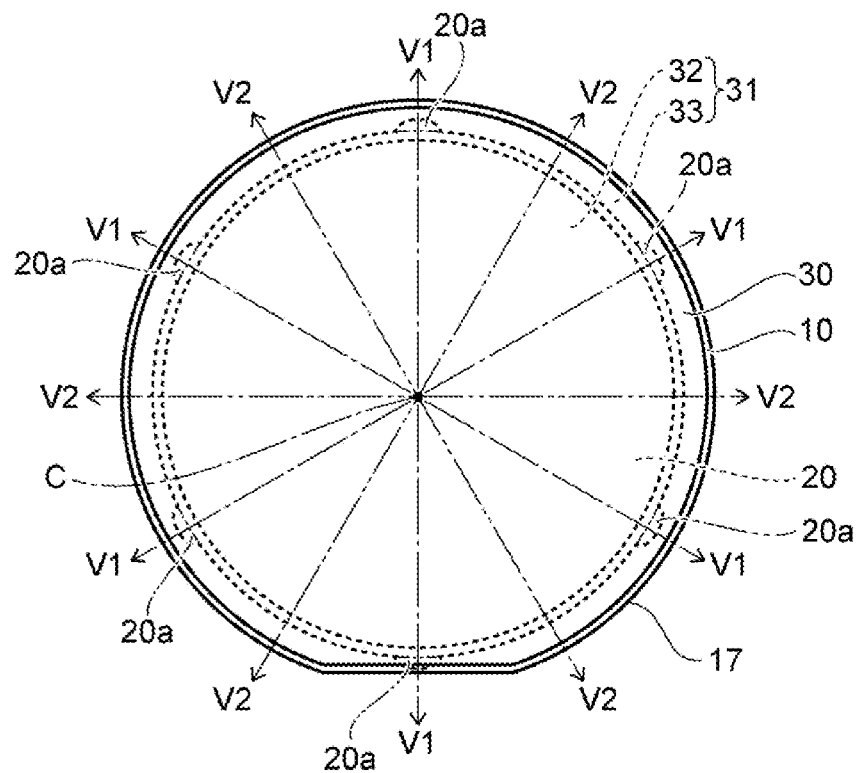
FIG. 6A is a schematic plan view illustrating the first wafer, the semiconductor layer, and the second wafer according to one embodiment of the present invention.
Figure 6B:
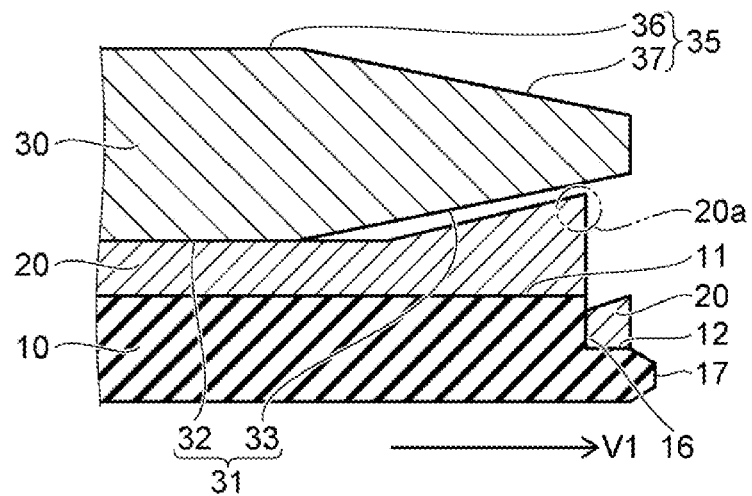
FIG. 6B is a schematic partial cross-sectional end view taken along one of the first directions in FIG. 6A.
Figure 6C:
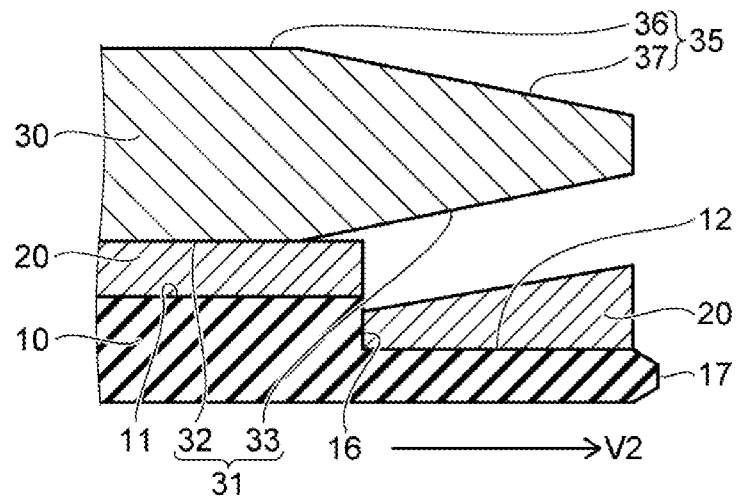
FIG. 6C is a schematic partial cross-sectional end view taken along one of the second directions shown in FIG. 6A.

FIG. 5 is a schematic bottom plan view illustrating a second wafer 30 according to the present embodiment. FIG. 6A is a schematic plan view illustrating the first wafer 10, the semiconductor layer 20, and the second wafer 30 according to the present embodiment. FIG. 6B is a schematic partial cross-sectional end view taken along one of the first directions V1 in FIG. 6A. FIG. 6C is a schematic partial cross-sectional end view taken along one of the second directions V2 shown in FIG. 6A.

As shown in FIG. 5 and FIG. 6A to FIG. 6C, a lower surface 31 of the second wafer 30 includes a flat portion 32 and an inclined portion 33. The flat portion 32 has a substantially circular shape and for example, the center C of the flat portion 32 coincides with the center C of the first wafer 10, in a top view. The inclined portion 33 is formed surrounding the flat portion 32. The inclined portion 33 inclines from the flat portion 32 toward the upper surface 35 of the second wafer 30.

In a similar manner, the second wafer 30 has an upper surface 35 including a flat portion 36 and an inclined portion 37. For example, the flat portion 36 of the second wafer 30 is substantially entirely overlapped with the flat portion 32 of the first wafer 10, and the inclined portion 37 of the second wafer 30 is substantially entirely overlapped with the inclined portion 33 of the first wafer 10 in a top view. The inclined portion 37 inclines from the flat portion 36 toward the lower surface 31 of the second wafer 30. Accordingly, the outer peripheral portion of the second wafer 30 has a thickness decreasing toward the edge of the second wafer 30. The inclined portions 33 and 37 respectively have a width of, for example, about 700 μm. The inclined portions 33 and 37 are, for example, a bevel portion of the second wafer 30.

In the bonding the second wafer 30 to the first wafer 10 (Step S3), the second wafer 30 is bonded to the first wafer 10 such that the outer end portions of the first wafer located in the first directions V1 as seen from the center C are opposite to the inclined portion 33 of the second wafer 30. Accordingly, the thick film portions 20a of the semiconductor layer 20 face the inclined portion 33 of the second wafer 30. The inclined portion 33 is located above the flat portion 32 such that at the time of bonding the semiconductor layer 20 of the first wafer 10 and the second wafer 30, the flat portion 32 of the second wafer 30 can be in contact with a flat portion other than the thick layer portions 20a of the semiconductor layer 20, while preventing the thick film portions 20a from coming in contact with the second wafer 30. Thus, the second wafer 30 can be reliably bonded to the first wafer 10 via the semiconductor layer 20.

In successive operations, using the second wafer 30 as a support substrate, a structure including the first wafer 10, the semiconductor layer 20, and the second wafer 30 is processed. For example, in the processing, the first wafer 10 serving as the growth substrate may be removed from the semiconductor layer 20. After the first wafer 10 is removed, the structure including the semiconductor layer 20 and the second wafer 30 is singulated. Accordingly, a plurality of semiconductor elements can be manufactured from the structure including the second wafer 30 and the semiconductor layer 20. The semiconductor elements are, for example, light-emitting elements such as light-emitting diodes (LEDs).

Next, effects of the embodiments will be described.

In the method of manufacturing semiconductor elements according to the present embodiment, the first region 11 and the second region 12 are provided on the upper surface 15 of the first wafer 10. Accordingly, when the semiconductor layer 20 is disposed on the upper surface 15, the outer end portion of the semiconductor layer 20 is located in the second region 12. The step 16 is formed between the first region 11 and the second region 12 such that propagation of the cracks occurring in the outer end portion of the semiconductor layer 20 are interrupted by the step 16, and are unlikely to propagate in the first region 11 of the semiconductor layer 20. Accordingly, a crack density in the semiconductor layer 20 can be reduced and thus the semiconductor elements can be manufactured with a good yield.

Further, in the present embodiment, the protrusions 14 are provided in portions in the first region 11 along the first directions V1 as seen from the center C. Accordingly, the first distance D1 between the edge 17 and the first region 11 in the first direction V1 as seen from the center C is set smaller than the second distance D2 between the edge 17 and the first region 11 in the second direction V2 as seen from the center C. Due to this arrangement, the thick film portions 20a of the semiconductor layer 20 are located outer side than the outer periphery of the circular part 13 by the protrusions 14, such that the thick film portions 20a face the inclined portion 33 of the second wafer 30 at the time of bonding the first wafer 10 and the second wafer 30. Accordingly, the thick film portions 20a can be prevented from being in contact with the second wafer 30. As a result, the second wafer 30 is allowed to adhere to the semiconductor layer 20 and is thus reliably secured. This allows for reliable operations performed after employing the second wafer 30 as the support substrate.

Thus, using the present embodiment, an improvement in yield of the semiconductor elements can be obtained while reliably performing the operations, and an improvement in productivity of the semiconductor elements can be achieved.

Comparative Example

Next, Comparative Example will be described.

Figure 7A:
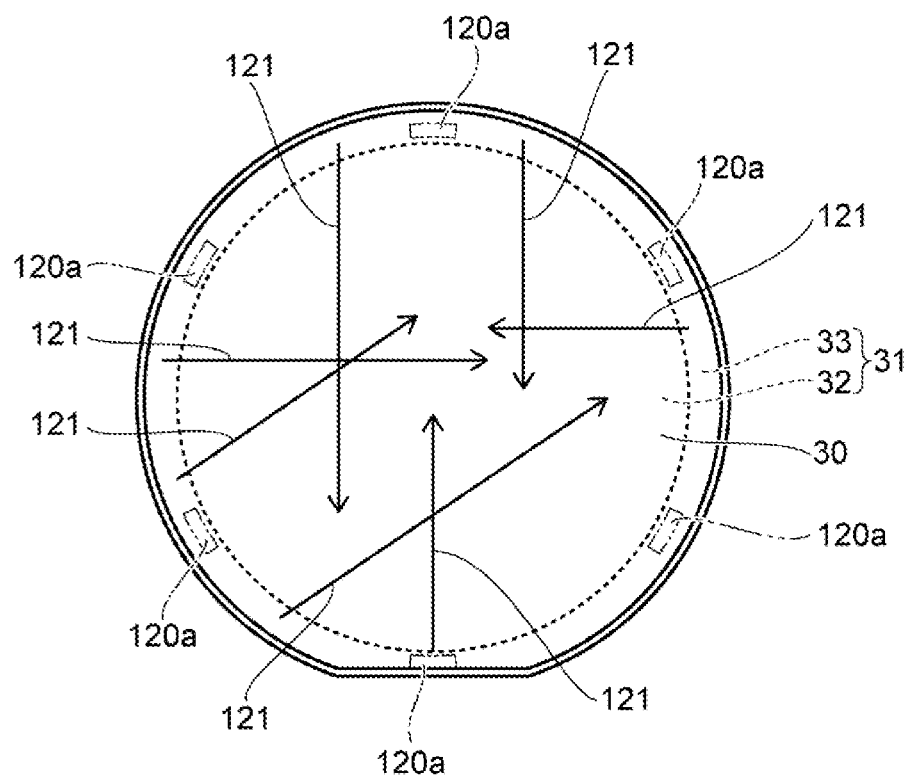
FIG. 7A is a schematic plan view illustrating a method of manufacturing semiconductor elements according to Comparative Example.
Figure 7B:
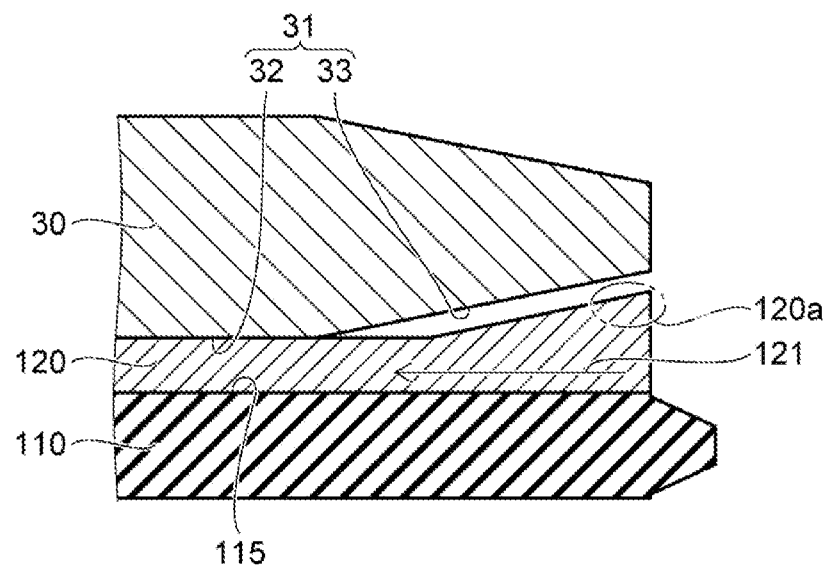
FIG. 7B is a schematic partial cross-sectional end view illustrating a method of manufacturing semiconductor elements according to Comparative Example.

FIG. 7A is a schematic plan view illustrating a method of manufacturing semiconductor elements according to Comparative Example. FIG. 7B is a schematic partial cross-sectional end view illustrating a method of manufacturing semiconductor elements according to Comparative Example.

As shown in FIG. 7A and FIG. 7B, a second region is not provided on the upper surface 115 of the first wafer 110 in the present Comparative Example. Accordingly, the upper surface 115 is entirely flat. A semiconductor layer 120 is disposed on the upper surface 115 of the first wafer 110. Similar to those described in the embodiment above, the outer peripheral portion of the semiconductor layer 120 has a relatively large thickness. In particular, as seen from the center C, the outer end portions located in the first directions V1 have thick film portions 120a that have greater thickness than the outer end portions of other directions.

Next, a second wafer 30 is bonded to the first wafer 110 via the semiconductor layer 120. At this time, the thick film portions 120a of the semiconductor layer 120 are opposite to the inclined portion 33 of the second wafer 30, such that the thick film portions 120a can be prevented from being in contact with the second wafer 30.

However, when the semiconductor layer 120 is formed using the first wafer 110 having entirely flat upper surface 115 as in the present comparative example, unintended growth of the semiconductor layer may occur at the outer end portion of the semiconductor layer 120, from which cracks 121 may occur. As described above, in the present comparative example, the upper surface 115 of the first wafer 110 is flat without any steps, such that cracks 121 occurring in the outer end portion of the semiconductor layer 120 may easily propagate into the center portion of the semiconductor layer 120. This results in a reduction in the yield of the semiconductor layer 120, which results in a reduction in the productivity of the semiconductor elements. Such cracks in the outer end portion of the semiconductor layer 120 tends to occur when the semiconductor layer 120 includes a semiconductor layer containing aluminum (Al). It is assumed that, as described above, unintended growth tends to occur in the outer end portion of the semiconductor layer 120 when a semiconductor layer containing aluminum (Al) is contained in the semiconductor layer 120, and cracks tends to occur in the portion of unintended growth.

Reference Example

Next, Reference Example will be described.

Figure 8A:
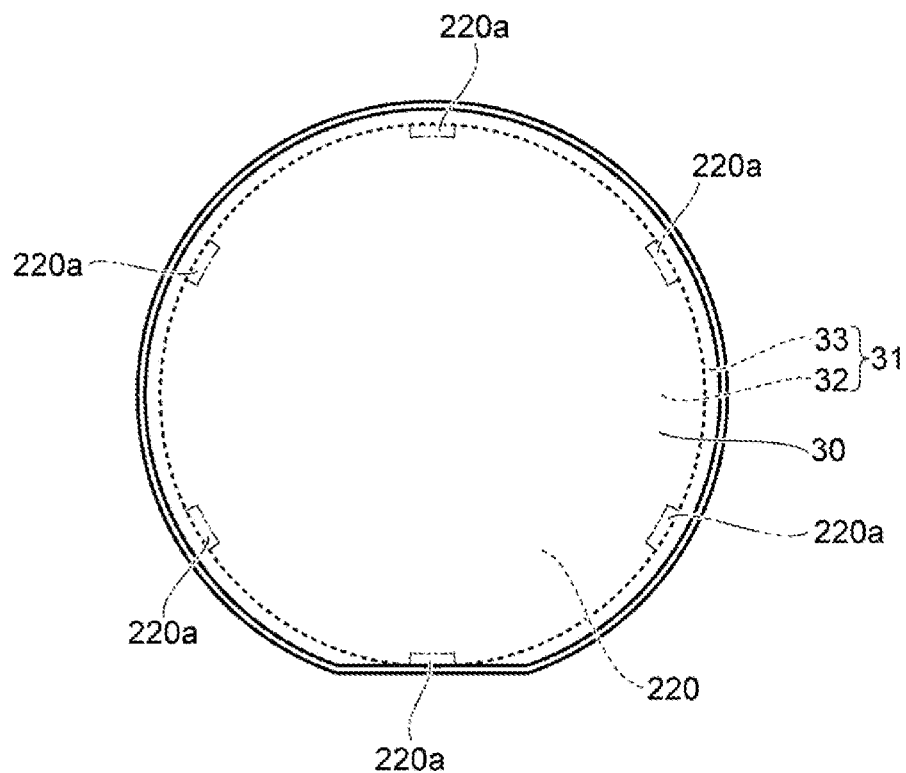
FIG. 8A is a schematic plan view illustrating a method of manufacturing semiconductor elements according to Reference Example.
Figure 8B:
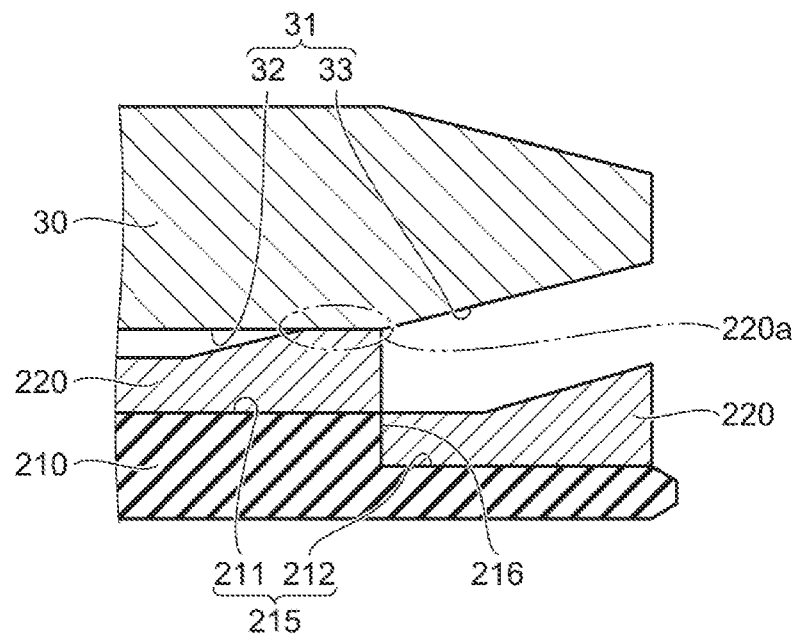
FIG. 8B is a schematic partial cross-sectional end view illustrating a method of manufacturing semiconductor elements according to Reference Example.

FIG. 8A is a schematic plan view illustrating a method of manufacturing semiconductor elements according to Reference Example FIG. 8B is a schematic partial cross-sectional end view illustrating a method of manufacturing semiconductor elements according to Reference Example.

As shown in FIG. 8A and FIG. 8B, in the Reference Example, a first region 211 and a second region 212 are provided on the upper surface 215 of the first wafer 210. Any protrusion is not provided in the first region 211 and the first region 211 has an outer periphery in a circular shape in a top view. Accordingly, the thick film portions 220a of the semiconductor layer 220 are formed in an outer peripheral portion in the first region 211 of the semiconductor layer 220 at locations in the first directions V1 as seen from the center C. The outline of the first wafer 210 is substantially the same as the outline of the second wafer 30. Because the first region 211 is not provided with any protrusions, the thick film portions 220a are abutted to the flat portion 32 of the lower surface 31 of the second wafer 30.

In the Reference Example, the second region 212 is provided on the upper surface 215 of the first wafer 210, such that even when cracks occur in the example of the semiconductor layer 220, propagation of the cracks are interrupted by the step 216 between the first region 211 and the second region 212. Accordingly, cracks generated in the outer end portion of the semiconductor layer 220 are unlikely to propagate into the center portion of the semiconductor layer 220.

However, in Reference Example, defect may occur at the time of bonding the second wafer 30 to the first wafer 210 via the semiconductor layer 220. More specifically, when the thick film portions 220a of the semiconductor layer 220 come in contact with the flat portion 32 of the second wafer 30, portions of the semiconductor layer 220 other than the thick film portions 220a may not be reliably brought in contact with the second wafer 30, which may cause defective bonding. Having such a bonding defect, sufficient stability in the structure containing the first wafer 210, the semiconductor layer 220, and the second wafer 30 cannot be obtained in successive manufacturing operations, which may result in a reduction in the productivity of the semiconductor elements.

Test Example

Next, test example will be described.

Figure 9A:
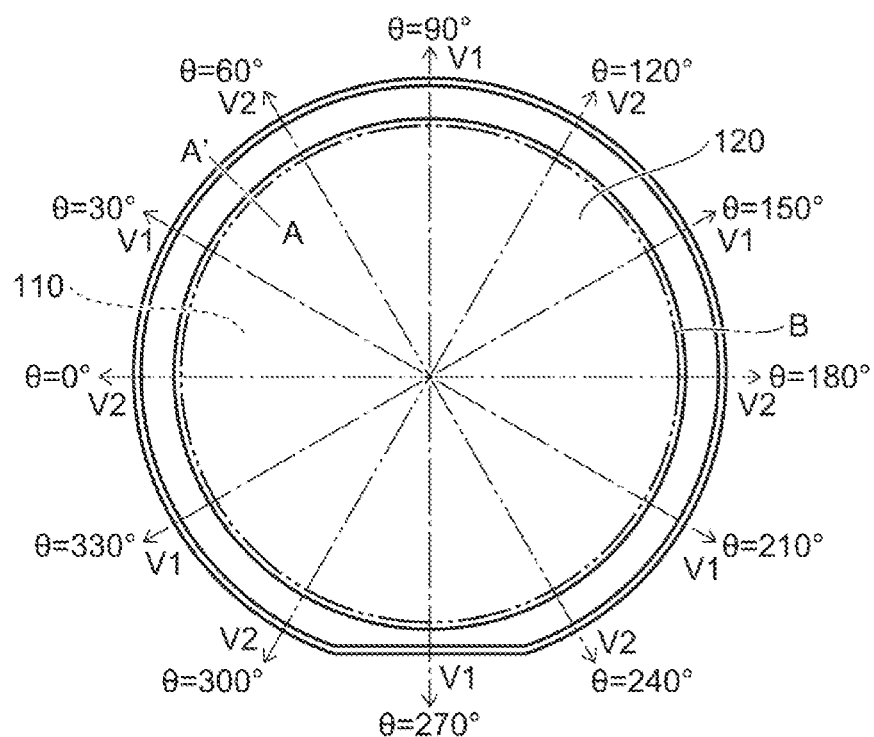
FIG. 9A is a schematic plan view illustrating the first wafer and the semiconductor layer according to one test example of the present invention.
Figure 9B:
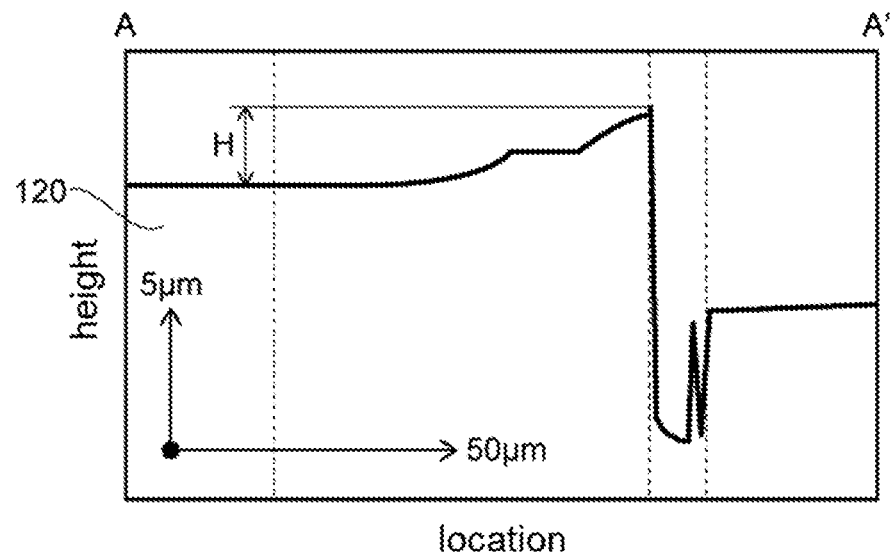
FIG. 9B is a graph in which the horizontal axis represents a location in a radius direction and the vertical axis represents a height of an upper surface of the semiconductor layer to illustrate the shape of the semiconductor layer taken along line segment A-A' shown in FIG. 9A.
Figure 9C:
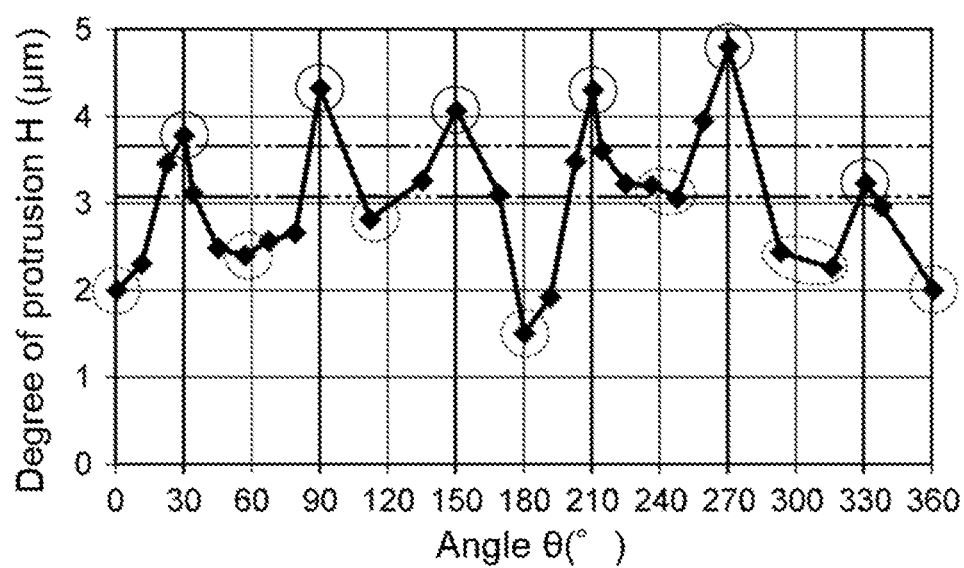
FIG. 9C is a graph in which the horizontal axis represents an angle θ and the vertical axis represents a protruding degree H to illustrate the shape of the semiconductor layer along the circle B shown in FIG. 9A.

FIG. 9A is a schematic plan view illustrating the first wafer 110 and the semiconductor layer 120 according to one test example of the present invention. FIG. 9B is a graph in which the horizontal axis represents a location in a radius direction and the vertical axis represents a height of an upper surface of the semiconductor layer 120 to illustrate the shape of the semiconductor layer 120 taken along line segment A-A' shown in FIG. 9A. FIG. 9C is a graph in which the horizontal axis represents an angle θ and the vertical axis represents a protruding degree H to illustrate the shape of the semiconductor layer 120 along the circle B shown in FIG. 9A.

The term "angle θ" used in the present specification refers to a central angle whose apex is the center C of the first wafer 110. The direction of θ=0° is in conformity to one of the second directions V2. The term "protruding amount H" used in the present specification refers to a difference between a height of an edge of the semiconductor layer 120 and a height of a location 70 μm spaced apart from the edge of the semiconductor layer 120 toward the center C. FIG. 9B and FIG. 9C show the measurement results obtained, for example, by using a surface roughness measuring device.

In the present test example, a semiconductor layer 120 containing a gallium nitride-based semiconductor was epitaxially grown on the first wafer 110 made of sapphire, by using a MOCVD method. The semiconductor layer 120 contains an n-type semiconductor layer, a p-type semiconductor layer, and a light emitting layer located between the n-type semiconductor layer and the p-type semiconductor layer. In the present test example and the comparative example and the reference example, the semiconductor layers are disposed under similar conditions. The semiconductor layer 120 is disposed with an average thickness of 10 μm.

As shown in FIG. 9B, the outer end portion becomes thicker than other portions in the semiconductor layer 120. As shown in FIG. 9C, the thickness of the outer end portion of the semiconductor layer 120 has an angle dependency such that as seen from the center C, portions located in the second directions V2 have a protruding amount H in a range of about 1.5 μm to about 3 μm, and portions located in the first directions V1 have a protruding amount H in a range of about 4 μm to about 5 μm. That is, the outer end portions in the first directions V1 were thicker than the outer end portions in the second directions V2.

For this reason, when the first region 211 has a circular outer shape as in the reference example described above, the thick film portions 220a of the semiconductor layer 220 are brought in contact with the flat portion 32 of the second wafer 30, defective bonding may occur. In order that the thick film portions 220a not to be brought in contact with the flat portion 32, a width in radial direction of the inclined portion 33 of the second wafer 30 may be increased, or the first wafer 210 having a diameter greater than that of the second wafer 30 may be employed. However, the size and shape of wafers have been standardized, such that a change in the size and/or shape requires a change in the specification of most of the processing devices used for the manufacturing semiconductor elements, resulting in a significant decrease in overall productivity of the semiconductor elements. Also, the number of semiconductor elements obtained by a series of operation may decrease.

In contrast, according to the embodiments described above, propagation of cracks can be interrupted and the thick film portions 20a can be prevented from being in contact with the second wafer 30, such that the semiconductor elements can be manufactured with good productivity, while using wafers complying existing standards.

The present disclosure can be used, for example, in manufacturing semiconductor elements such as light-emitting diodes (LEDs) and laser diodes (LDs).

It is to be understood that although embodiments of the present invention have been described, various other embodiments and variants may occur to those skilled in the art that are within the scope and spirit of the invention, and such other embodiments and variants are intended to be encompassed by the following claims.

What is claimed is:

1. A method of manufacturing semiconductor elements, the method comprising:
   disposing a semiconductor layer made of a nitride semiconductor on a first wafer; and
   bonding a second wafer to the first wafer via the semiconductor layer;
   wherein the first wafer has an upper surface that includes a first region and a second region surrounding a periphery of the first region and located lower than the first region,
   wherein, in a top view of the first wafer, a first distance between an edge of the first wafer and the first region of the first wafer in each of a plurality of first directions passing through a center of the first wafer and being parallel to respective m-axes of the semiconductor layer is smaller than a second distance between the edge of the first wafer and the first region of the first wafer in each of a plurality of second directions passing through the center of the first wafer and being parallel to respective a-axes of the semiconductor layer,
   wherein the second wafer has a lower surface and an upper surface, the lower surface including a flat portion and an inclined portion surrounding the flat portion, the inclined portion inclining upward toward the upper surface, and
   wherein, in said bonding the second wafer, the second wafer is bonded to the first wafer such that outer end portions of the first wafer located in the first directions are opposite to the inclined portion of the second wafer.

2. The method of manufacturing semiconductor elements according to claim 1, wherein outer end portions of the semiconductor layer in the first directions have a thickness greater than a thickness of outer end portions of the semiconductor layer located in the second directions.

3. The method of manufacturing semiconductor elements according to claim 2, wherein the first wafer comprises sapphire.

4. The method of manufacturing semiconductor elements according to claim 2, wherein the second region is located at least 2 μm lower than the first region.

5. The method of manufacturing semiconductor elements according to claim 2, wherein the second distance is in a range of 1 mm to 10 mm.

6. The method of manufacturing semiconductor elements according to claim 5, wherein the first distance is in a range of 0.1 mm to 5 mm.

7. The method of manufacturing semiconductor elements according to claim 2, wherein the semiconductor layer is disposed on the first region and the second region.

8. The method of manufacturing semiconductor elements according to claim 2, wherein the semiconductor layer is made of $In_XAl_YGa_{1-X-Y}N$ ($0 \leq X$, $0 \leq Y$, $X+Y \leq 1$).

9. The method of manufacturing semiconductor elements according to claim 1, wherein the first wafer comprises sapphire.

10. The method of manufacturing semiconductor elements according to claim 9, wherein the second region is located at least 2 μm lower than the first region.

11. The method of manufacturing semiconductor elements according to claim 9, wherein the second distance is in a range of 1 mm to 10 mm.

12. The method of manufacturing semiconductor elements according to claim 11, wherein the first distance is in a range of 0.1 mm to 5 mm.

13. The method of manufacturing semiconductor elements according to claim 9, wherein the semiconductor layer is disposed on the first region and the second region.

14. The method of manufacturing semiconductor elements according to claim 1, wherein the second region is located at least 2 μm lower than the first region.

15. The method of manufacturing semiconductor elements according to claim 1, wherein the second distance is in a range of 1 mm to 10 mm.

16. The method of manufacturing semiconductor elements according to claim 15, wherein the first distance is in a range of 0.1 mm to 5 mm.

17. The method of manufacturing semiconductor elements according to claim 1, wherein the semiconductor layer is disposed on the first region and the second region.

18. The method of manufacturing semiconductor elements according to claim 1, wherein the semiconductor layer is made of $In_XAl_YGa_{1-X-Y}N$ ($0 \leq X$, $0 \leq Y$, $X+Y \leq 1$).

* * * * *